United States Patent
Yoshinaga

(10) Patent No.: US 6,492,587 B1
(45) Date of Patent: Dec. 10, 2002

(54) EMI SHIELD FILTER AND DISPLAY APPARATUS HAVING EMI SHIELD FILTER

(75) Inventor: Takashi Yoshinaga, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/597,936

(22) Filed: Jun. 20, 2000

(30) Foreign Application Priority Data

Jun. 21, 1999 (JP) .......................................... 11-174691

(51) Int. Cl.⁷ ................................................. H05K 9/00
(52) U.S. Cl. ............................. 174/35 R; 174/35 MS; 361/818; 348/819
(58) Field of Search ........................... 174/35 MS, 35 R; 361/816, 817, 818, 800; 348/818, 819, 820

(56) References Cited

U.S. PATENT DOCUMENTS 4,468,702 A * 8/1984 Jandrell ...................... 358/245
4,910,090 A * 3/1990 Kuhlman et al. ............ 428/469
4,978,812 A * 12/1990 Akeyoshi et al. ......... 174/35 MS
6,086,979 A * 7/2000 Kanbara et al. ............ 428/209

FOREIGN PATENT DOCUMENTS

JP 62-109495 7/1987
JP 9-247584 9/1997

* cited by examiner

Primary Examiner—Dean A. Reichard
Assistant Examiner—Carmelo Oliva
(74) Attorney, Agent, or Firm—Katten, Muchin, Zavis, Rosenman

(57) ABSTRACT

An EMI (ElectroMagnetic Interference) shield filter for a display unit has a conductive mesh in which a plurality of first and second conductors are arranged in horizontal and vertical directions. A gap in one of the first and second conductors is set larger than that in the other one of the first and second conductors that attenuate a field strength of higher one of horizontal and vertical polarized components of EMI of the display unit, so that the horizontal and vertical polarized components have substantially the same field strength after attenuation. A display apparatus having this EMI shield filter is also disclosed.

11 Claims, 5 Drawing Sheets

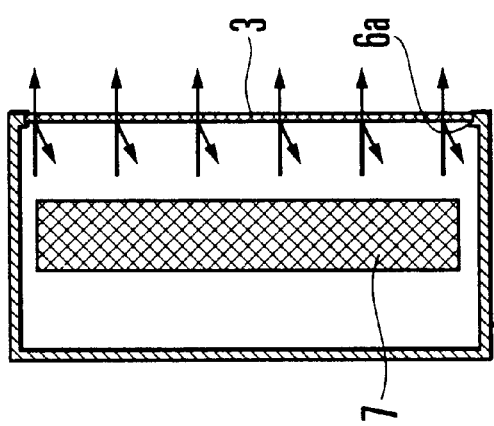
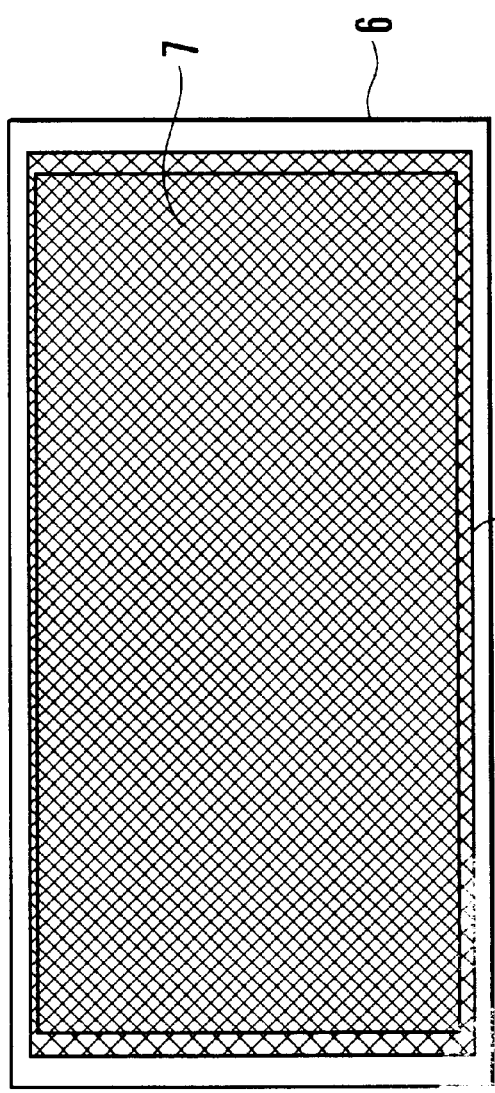
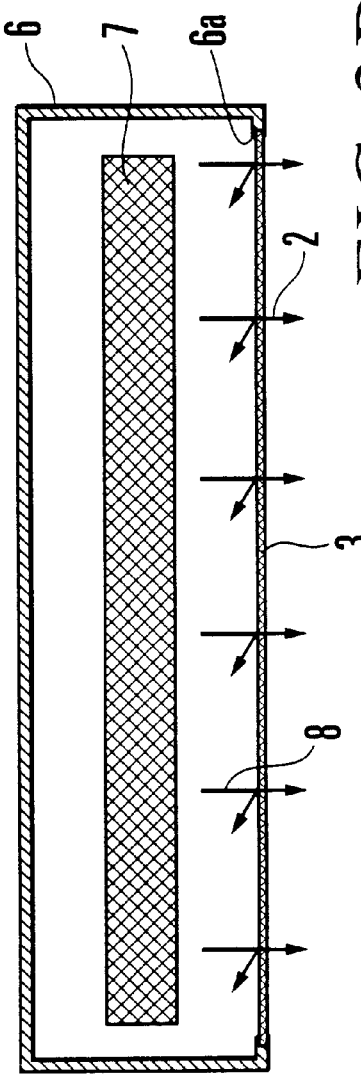

US 6,492,587 B1

EMI SHIELD FILTER AND DISPLAY APPARATUS HAVING EMI SHIELD FILTER

BACKGROUND OF THE INVENTION

The present invention relates to an EMI (ElectroMagnetic Interference) shield technique and, more particularly, to an EMI shield filter to be attached to the screen of a display apparatus and a display apparatus having this EMI shield filter.

The EMI standards such as CISPR22 recommended by CISPR (abbreviation of French representation for International Special Committee on Radio Interference) regulate the radiation amounts (limit values) of the vertical and horizontal polarized waves of the EMI radiated from the equipment.

An EMI shield filter must have a high electromagnetic shield performance against electromagnetic waves radiated from a display apparatus and the like on the basis of the standards, and good light transmission properties as a display apparatus.

A display apparatus, e.g., a plasma display, employs the principle of emitting light by utilizing the electric discharge phenomenon of its surface. Accordingly, radiation of electromagnetic waves in the range of about 30 MHz to 130 MHz from the screen is not small, and a shield is necessary. A conventional electromagnetic wave shield adopts a method of attaching an EMI shield filter to the front surface of the screen.

As such an EMI shield filter, one that causes light transmission with the structure of a conductive mesh with a small gap is used. Other than the mesh structure, alternatively, an EMI shield filter as shown in Japanese Patent Laid-Open No. 9-247584 (reference 1) is used, on which a light-transmitting thin film is formed by sputtering a metal, e.g., silver or gold, or vacuum-depositing a metal, e.g., tin oxide, on the filter base.

When the display apparatus is a CRT (Cathode-Ray Tube), electromagnetic waves such as X-rays are radiated from the display screen. Conventionally, as an electromagnetic wave shield for reducing radiation, one in which a plate-like main body such as an iron foil having a large number of through holes is adhered to a light-transmitting film is known, as shown in Japanese Utility Model Laid-Open No. 62-109495 (reference 2).

FIG. 4 shows an electromagnetic wave leakage prevention filter described in reference 1, which employs a conductive mesh structure. The width of the conductors is set to 15 μm, and the gaps between conductors in the vertical and horizontal directions that constitute the conductive mesh are both set to 127 μm. This conductive mesh is fabricated by forming conductors by electroless-plating a metal such as copper, then electroless-plating a metal such as nickel on the plated conductors, and by etching the conductors.

As a conductive mesh, one can also be used which is formed by adhering metal fabric, obtained by electroless-plating copper or copper nickel to a synthetic resin mesh fabric, to a filter base.

With the filter of reference 1, the conductors themselves that constitute the mesh do not transmit light, but the mesh structure imparts light transmission properties to the filter. For this purpose, the mesh is obliquely tilted with an inclination of 45°, so mesh-is not overlaid on the rows and columns (horizontal and vertical directions) of pixels of the plasma display to obstruct the image.

Each of FIGS. 5A to 5D shows the electromagnetic wave shield filter described in reference 2 for mainly shielding X-rays radiated from the CRT. In the main body of this electromagnetic wave shield filter, through holes are formed in a copper or iron foil. The through holes can have various shapes, e.g., a circular shape (FIG. 5A), a hexagonal shape (FIG. 5B), a rectangular shape (FIG. 5C), and a slit shape (FIG. 5D).

Regarding the EMI shield filter with the mesh structure, if the same shield material is used, the smaller the mesh, the higher the shield performance, and the thicker the material, the higher the shield performance. Regarding the electromagnetic waves radiated from the display apparatus, since the EMI standards must be satisfied, an EMI shield filter having a conventional mesh structure uses a fine mesh structure at the cost of the light transmission properties.

Of the mesh structure having a conductor width of 15 μm and a conductor-to-conductor distance of 127 μm as shown in FIG. 4, when the transmittance (opening ratio) is calculated, it is $((127-15)\times(127-15))/(127\times127)=77.8$ (%), that is, it is a low ratio of about 78%. When this electromagnetic wave leakage prevention filter is attached, the light transmittance is decreased 22%, and the brightness of the screen decreases largely. This means that to maintain a high screen brightness inversely, an excessively large power corresponding to an increase in transmittance of 22% must be supplied to the display apparatus.

In the conventional X-ray shield filters shown in FIGS. 5A to 5D, although the plurality of through holes formed in the plate-like filter main body have various types of shapes, these filters do not realize increases in both shield performance and transmittance realized by considering the characteristics of the display apparatus.

SUMMARY OF THE INVENTION

It is an object of the present invention to provide an EMI shield filter which aims at improving the light transmittance while the requirement as the EMI shield filter is met, and a display apparatus.

It is another object of the present invention to provide a display apparatus having an EMI shield filter which can realize predetermined brightness and decrease power consumption.

In order to achieve the above objects, according to the present invention, there is provided an EMI (ElectroMagnetic Interference) shield filter for a display unit, with a conductive mesh in which a plurality of first and second conductors are arranged in horizontal and vertical directions, wherein a gap in one of the first and second conductors is set larger than that in the other one of the first and second conductors that attenuate a field strength of higher one of horizontal and vertical polarized components of EMI of the display unit, so that the horizontal and vertical polarized components have substantially the same field strength after attenuation.

BRIEF DESCRIPTION OF THE DRAWINGS

FIGS. 3A, 3B, and 3C are front, sectional plan, and sectional side views, respectively, of a plasma display apparatus to which the EMI shield filter shown in FIG. 1 is attached;

DESCRIPTION OF THE PREFERRED EMBODIMENT

The present invention will be described in detail with reference to the accompanying drawings.

Figure 1:
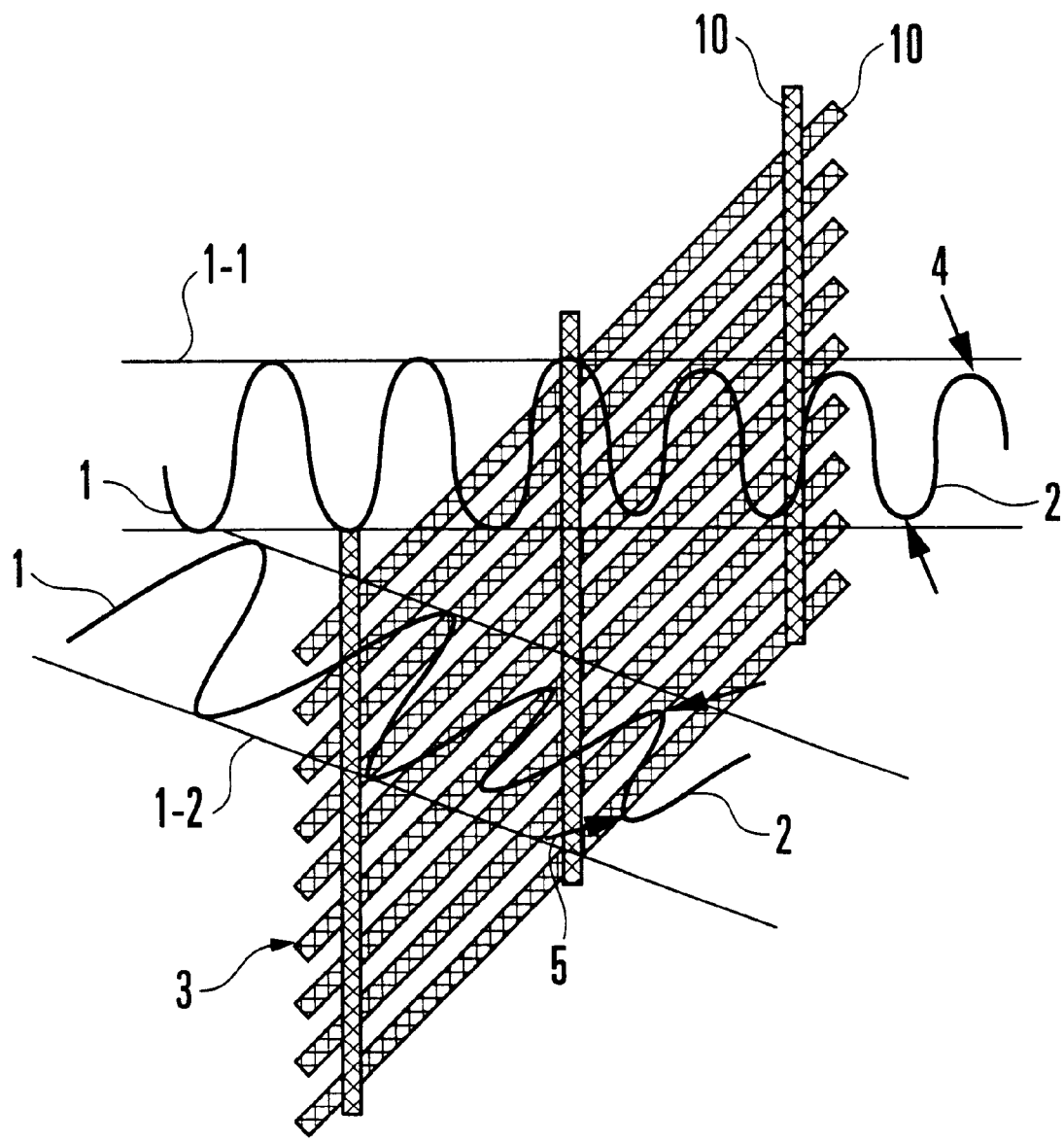
FIG. 1 is a perspective view of an EMI shield filter according to an embodiment of the present invention.

FIG. 1 shows an EMI shield filter according to an embodiment of the present invention, which is to be attached to the display screen of a plasma display panel. As shown in FIG. 1, an EMI shield filter 3 is constituted by a structure in which conductors 10 are arranged in a mesh structure (matrix structure) in the horizontal and vertical directions. The conductive blind structure extending in the vertical direction shields the electromagnetic waves of the vertical polarized waves, and the conductive blind structure extending in the horizontal direction shields the magnetic waves of the horizontal polarized waves.

Generally, in a plasma display, in relation to the EMI standards for the ITE (Information Technology Equipment) determined by the CISPR22 described above, the field strength measured at 3 m from the display screen is controlled such that the measurement value of the larger one of the vertical and horizontal polarized components of the display apparatus becomes equal to the rated value (limit value) of 50 dB$\mu$v/m or less.

In this embodiment, since the field strength of the horizontal polarized component of the EMI is larger than that of the vertical polarized component, the gap between the conductors 10 in the vertical direction is set such that the amount of electromagnetic waves after being transmitted through the EMI shield filter 3 satisfies the EMI standards. With respect to this gap, the gap between the conductors 10 in the horizontal direction is increased, and the field strength of the vertical polarized component is increased to almost equal to the EMI standards, thereby improving the light transmittance (opening ratio).

The operation of the EMI shield filter 3 shown in FIG. 1 will be described.

EMI shield which attenuates the electromagnetic waves of the entering electromagnetic waves 1 with the EMI shield filter 3 formed of the conductive mesh is realized, and some of the entering waves 1 are transmitted as transmitted waves 2. To comply with the EMI standards, the entering waves 1 are classified into a vertical polarized component 1-1 and a horizontal polarized component 1-2. The horizontal and vertical polarized components 1-2 and 1-1 pass through the conductive mesh formed by the conductors 10 with small gaps (mesh gap) in the vertical direction and a large gap in the horizontal direction.

Since the horizontal polarized component 1-2 passes through the conductive mesh in which the conductors 10 have small gaps in the vertical direction, its potential difference in the horizontal direction decreases. As a result, the potential difference in a space after transmission is suppressed low, and the transmitted horizontal polarized component 1-2 is attenuated largely. Since the vertical polarized component 1-1 passes through the conductive mesh in which the conductors 10 have large gaps in the horizontal direction, its potential difference in the vertical direction becomes larger than that in the horizontal direction. The potential difference in the space after transmission is comparatively high, so that the transmitted vertical polarized component 1-1 is attenuated comparatively less than the horizontal polarized component 1-2 is.

In this manner, of the electromagnetic waves radiated from the display apparatus, the vertical polarized component 1-1 is less than the horizontal polarized component 1-2, but attenuation of the vertical polarized component 1-1 by the EMI shield filter 3 is smaller than that of the horizontal polarized component 1-2. Therefore, of the electromagnetic waves after transmission through the EMI shield filter 3, both the vertical and horizontal polarized components 1-1 and 1-2 can be attenuated in substantially the same electromagnetic wave amount.

As a result, when transmitting light, as the gap between the conductors 10 in the horizontal direction can be made large, both the polarized components 1-1 and 1-2 can be attenuated to electromagnetic wave amounts complying with the EMI standards. Simultaneously, the opening ratio of the electromagnetic filter becomes larger than that of the conventional electromagnetic filter, thereby increasing the light transmittance.

Figure 2:
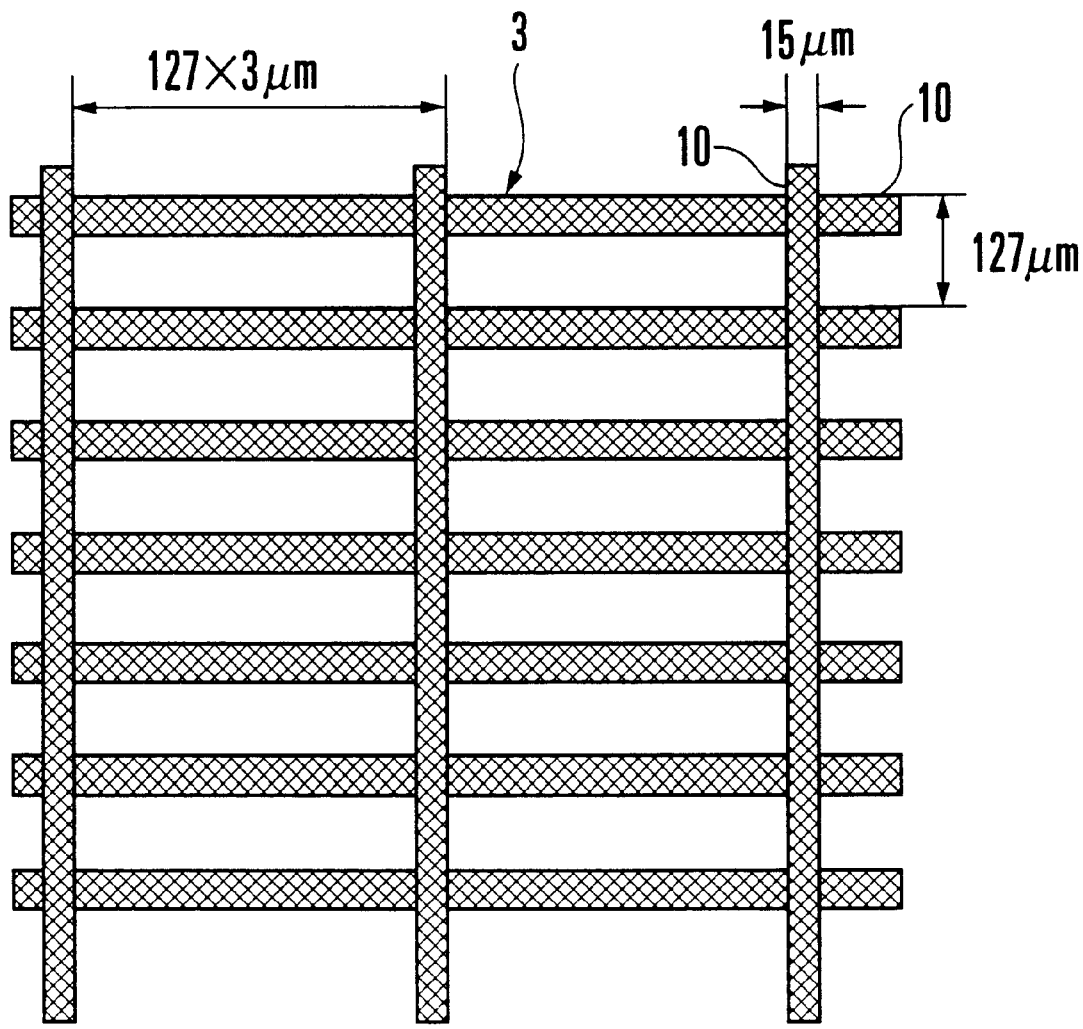
FIG. 2 is an enlarged plan view of the mesh structure of the EMI shield filter shown in FIG. 1.

FIG. 2 shows a practical example of the mesh structure shown in FIG. 1.

Figure 4:
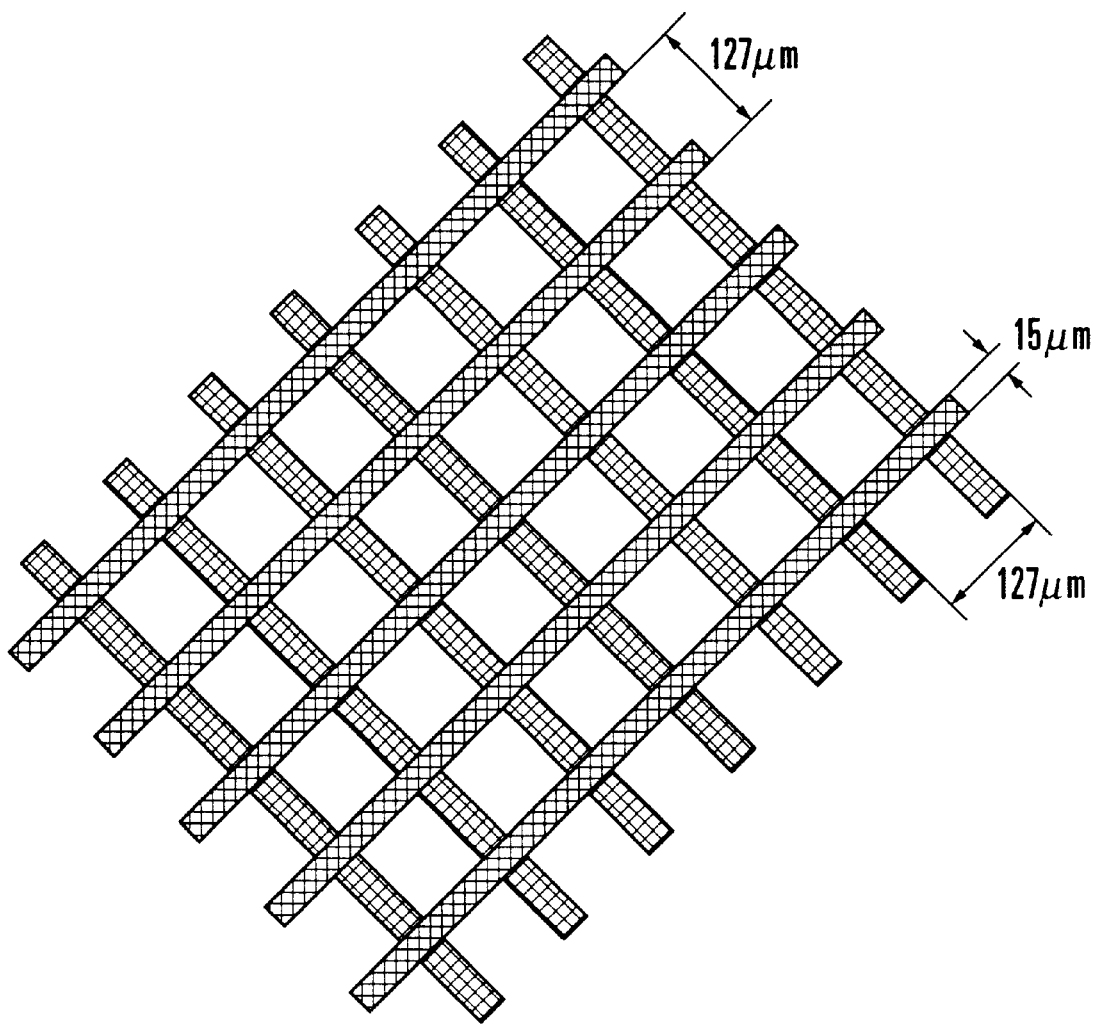
FIG. 4 is a plan view showing an example of a conventional electromagnetic shield filter.
Figure 5A:
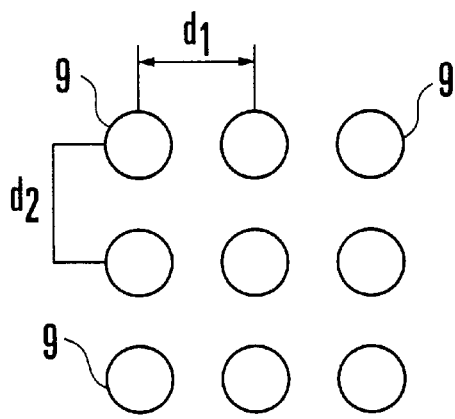
FIGS. 5A to 5D are views showing other examples of conventional electromagnetic shield filters having various types of light transmitting shapes.
Figure 5B:
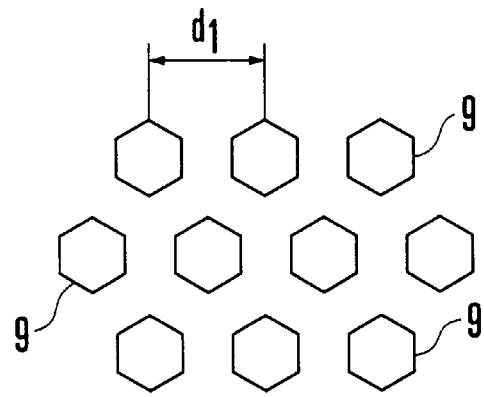
Figure 5C:
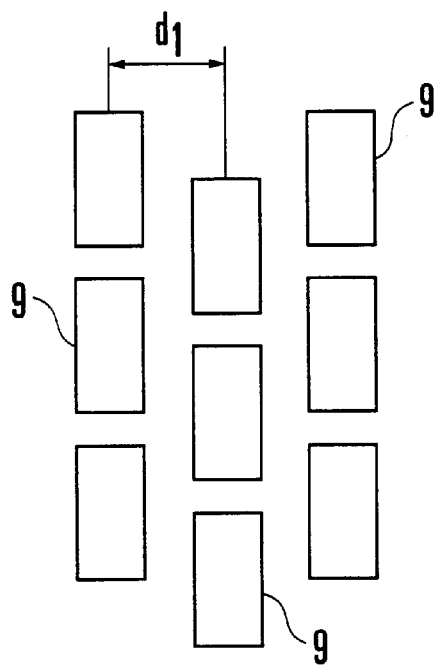
Figure 5D:
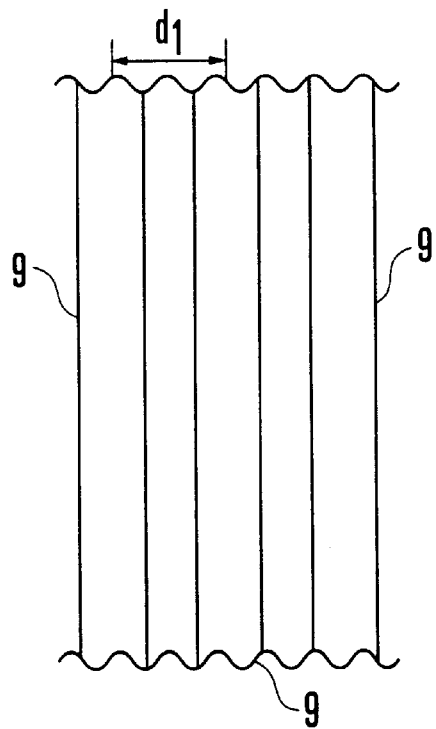

In the mesh structure of the EMI shield filter 3, the conductor width is 15 $\mu$m, and the mesh gaps in the vertical and horizontal directions are respectively 127 $\mu$m and 127×3 $\mu$m. In this case, the transmittance (opening ratio) is ((127−15)×(127×3−15))/ (127×(127×3))=84.7%. This light transmittance is improved over that of the conventional filter shown in FIG. 4, which has mesh gaps of 127 $\mu$m in both the horizontal and vertical directions, by about 8.5%.

According to this embodiment, by utilizing the characteristics of the electromagnetic waves radiated from the display screen, the shield characteristics for either the vertical or horizontal polarized component, of the two polarization directions are intentionally sacrificed within the EMI standards to improve the light transmittance.

If attenuation of the vertical polarized component can be decreased because of the characteristics of the display apparatus, when forming the mesh structure of the EMI shield filter, the gaps between the conductors extending in the vertical direction are made more large than the mesh density of the conventional product. Regarding the horizontal polarized component, the mesh gap between the conductors extending in the horizontal direction is set to the same level as that of the conventional product, so that the vertical polarized component is attenuated less than the horizontal polarized component. Since the mesh gaps are made large in the horizontal direction, the light transmittance increases, and a filter having a higher light transmittance than the conventional product can be formed.

FIGS. 3A to 3C show a plasma display to which the EMI shield filter 3 shown in FIG. 1 is attached. Referring to FIGS. 3A to 3C, the plasma display is comprised of a box-like housing 6 with an opening 6a in its front surface, a thick, rectangular plasma display panel 7 supported in the housing 6, and the rectangular EMI shield filter 3 arranged in the opening 6a of the housing 6 and slightly larger than the plasma display panel 7.

The EMI shield filter 3 is electrically connected to the housing 6 at its entire periphery (four sides). The gap of this electrical connection may change depending on the frequency as the shield target. To enhance the EMI shield effect, the electrical connection may be made with a minimum gap at a low impedance.

In the mesh structure of the EMI shield filter 3, the mesh gaps are increased in the horizontal direction. By increasing the mesh gaps, the shield effect for one polarization surface can be decreased and the transmittance (opening ratio) can be increased. If the mesh gaps are excessively increased, the shield effect for the other polarization surface may decrease. The reference for the upper limit of the mesh gaps may be $\frac{1}{20}$ to $\frac{1}{100}$ the wavelength of the target frequency. However, this value is not sufficient, and much narrower gaps are sometimes necessary. Of electromagnetic radiation from the plasma display, the upper light frequency of waves radiated from the front surface and requiring EMI shield is, e.g., approximately 300 MHz. Therefore, the wavelength is 1,000 mm, and the upper limit of the necessary mesh gaps is 10 mm to 50 mm.

Since the housing 6 is made of a conductive material, it shields EMI radiation from the plasma display panel 7. The EMI shield filter 3 shields (reflects and absorbs) EMI radiation from the opening 6a, and transmitted waves 2 are radiated outside the housing 6.

In the EMI standards, the polarized components of both the vertical and horizontal polarized waves are regulated to have the same rated value. According to this embodiment, if the polarization plane can sufficiently meet the requirement of EMI shield to comply with the standards, the mesh gaps corresponding to this polarization plane are made large, and the brightness of the display screen is increased by utilizing the fact that the light transmittance increases in inverse proportion to the gap. More specifically, the shield characteristics of either the vertical or horizontal polarized component, of the two polarized waves, are intentionally sacrificed, so that the light transmittance can be increased while satisfying the EMI standards.

In the above embodiment, to form the EMI shield filter, a filter with a large mesh size in the horizontal direction is used. Depending on the radiation characteristics of the display apparatus, the mesh structure may be rotated through 90°, to obtain a large mesh size in the vertical direction.

In the above embodiment, an EMI shield filter is applied to a plasma display apparatus. However, the present invention can naturally be applied to other display apparatuses such as a CRT. As the arrangement of the EMI shield filter of the present invention, a structure in which a filter is adhered to a plastic or glass plate or is sandwiched by plastic or glass plates may be preferable.

As has been described above, according to the present invention, the EMI is examined upon classifying it into horizontal and vertical components. From the result of examination, the conductive mesh is formed to have different gaps in the vertical and horizontal directions. More specifically, the characteristics of the display apparatus are measured. The radiation amounts of the electromagnetic waves of both the vertical and horizontal polarized waves are compared with the EMI rated standard value. To decrease the shield effect in the polarization direction having a smaller radiation amount, the mesh gaps in a direction corresponding to this are made large. As a result, the EMI rated standard value can be satisfied, and the light transmission amount can be increased more than that in the conventional product.

What is claimed is:

1. An EMI (ElectroMagnetic Interference) shield filter for a display unit, having a conductive mesh in which a plurality of first and second conductors are arranged in horizontal and vertical directions, wherein a first gap between each two adjacent conductors of one of said first and second conductors is set larger than a second gap between each two adjacent conductors of the other one of said first and second conductors that attenuate a field strength of a higher one of horizontal and vertical polarized components of EMI of said display unit, said first gap and said second gap being selected so that the horizontal and vertical polarized components have substantially the same field strength after attenuation, the first gap being no greater than 50 mm.

2. A filter according to claim 1, wherein said display unit is a plasma display.

3. A filter according to claim 1, wherein the first gap is set to about three times the second gap.

4. A filter according to claim 1, wherein when said first and second conductors have a width of 15 $\mu$m and the second gap is 127 $\mu$m, the first gap is set to 381 $\mu$m.

5. A filter according to claim 1, wherein the first gap is set to $\frac{1}{20}$ to $\frac{1}{100}$ of a wavelength of electromagnetic radiation passing through the filter.

6. A display apparatus comprising a housing incorporating said display unit and having an opening in a front surface thereof, and an EMI (ElectroMagentic Interference) shield filter attached to said opening and having a conductive mesh in which a plurality of first and second conductors are arranged in horizontal and vertical directions, wherein, in said EMI shield filter, a first gap between each two adjacent conductors of one of said first and second conductors is set larger than a second gap between each two adjacent conductors of the other one of said first and second conductors that attenuate a field strength of a higher one of horizontal and vertical polarized components of EMI of said display unit, said first gap and said second gap being selected so that the horizontal and vertical polarized components have substantially the same field strength after attenuation, the first gap being no greater than 50 mm.

7. An apparatus according to claim 6, wherein said display unit is a plasma display.

8. An apparatus according to claim 6, wherein the first gap is set to about three times the second gap.

9. An apparatus according to claim 6, wherein when said first and second conductors have a width of 15 $\mu$m and the second gap is 127 $\mu$m, the first gap is set to 381 $\mu$m.

10. An apparatus according to claim 6, wherein the first gap is set to $\frac{1}{20}$ to $\frac{1}{100}$ of a wavelength of electromagnetic radiation passing through said EMI shield filter.

11. An apparatus according to claim 6, wherein the horizontal and vertical polarized components after attenuation by said EMI shield filter have field strengths of not more than 50 dB$\mu$v/m when measured at a distance of 3 m from said display unit.

* * * * *